US009601475B2

(12) United States Patent
Brunnbauer et al.

(10) Patent No.: US 9,601,475 B2
(45) Date of Patent: Mar. 21, 2017

(54) WORKPIECE WITH SEMICONDUCTOR CHIPS, SEMICONDUCTOR DEVICE AND METHOD FOR PRODUCING A WORKPIECE WITH SEMICONDUCTOR CHIPS

(71) Applicant: Intel Deutschland GmbH, Neubiberg (DE)

(72) Inventors: Markus Brunnbauer, Lappersdorf (DE); Thorsten Meyer, Regensburg (DE); Stephan Bradl, Regensburg (DE); Ralf Plieninger, Poing (DE); Jens Pohl, Bernhardswald (DE); Klaus Pressel, Regensburg (DE); Recai Sezi, Roettenbach (DE)

(73) Assignee: Intel Deutschland GmbH, Neubiberg (DE)

( * ) Notice: Subject to any disclaimer, the term of this patent is extended or adjusted under 35 U.S.C. 154(b) by 0 days.

(21) Appl. No.: 15/041,127

(22) Filed: Feb. 11, 2016

(65) Prior Publication Data

US 2016/0163682 A1    Jun. 9, 2016

Related U.S. Application Data

(60) Division of application No. 14/330,066, filed on Jul. 14, 2014, now Pat. No. 9,293,423, which is a
(Continued)

(30) Foreign Application Priority Data

Apr. 30, 2007  (DE) .................. 10 2007 020 656

(51) Int. Cl.
*H01L 21/301* (2006.01)
*H01L 25/00* (2006.01)
(Continued)

(52) U.S. Cl.
CPC ............ *H01L 25/50* (2013.01); *H01L 21/486* (2013.01); *H01L 21/4853* (2013.01);
(Continued)

(58) Field of Classification Search
CPC . H01L 21/486; H01L 21/4853; H01L 21/565; H01L 21/568; H01L 25/50; H01L 24/96; H01L 24/97
(Continued)

(56) References Cited

U.S. PATENT DOCUMENTS 5,151,769 A    9/1992  Immorlica et al.
5,371,404 A    12/1994  Juskey et al.
(Continued)

FOREIGN PATENT DOCUMENTS

EP    0611129 A2    8/1994
FR    2843485 A1    2/2004

OTHER PUBLICATIONS

Non-Final Office Action dated Jul. 9, 2009 for U.S. Appl. No. 11/746,936.
(Continued)

*Primary Examiner* — Nitin Parekh
(74) *Attorney, Agent, or Firm* — Eschweiler & Potashnik, LLC (57) ABSTRACT

A workpiece has at least two semiconductor chips, each semiconductor chip having a first main surface, which is at least partially exposed, and a second main surface. The workpiece also comprises an electrically conducting layer, arranged on the at least two semiconductor chips, the electrically conducting layer being arranged at least on regions of the second main surface, and a molding compound, arranged on the electrically conducting layer.

20 Claims, 5 Drawing Sheets

Related U.S. Application Data continuation of application No. 13/673,318, filed on Nov. 9, 2012, now Pat. No. 8,779,563, which is a continuation of application No. 11/746,936, filed on May 10, 2007, now Pat. No. 8,309,454.

(51) Int. Cl.

| | | |
|---|---|---|
| *H01L 21/56* | (2006.01) | |
| *H01L 23/31* | (2006.01) | |
| *H01L 23/538* | (2006.01) | |
| *H01L 23/552* | (2006.01) | |
| *H01L 23/60* | (2006.01) | |
| *H01L 23/00* | (2006.01) | |
| *H01L 23/48* | (2006.01) | |
| *H01L 21/48* | (2006.01) | |

(52) U.S. Cl.
CPC .......... *H01L 21/561* (2013.01); *H01L 21/565* (2013.01); *H01L 21/568* (2013.01); *H01L 23/3128* (2013.01); *H01L 23/48* (2013.01); *H01L 23/5389* (2013.01); *H01L 23/552* (2013.01); *H01L 23/60* (2013.01); *H01L 24/19* (2013.01); *H01L 24/96* (2013.01); *H01L 24/97* (2013.01); *H01L 2224/0401* (2013.01); *H01L 2224/04105* (2013.01); *H01L 2224/12105* (2013.01); *H01L 2224/20* (2013.01); *H01L 2224/97* (2013.01); *H01L 2924/01006* (2013.01); *H01L 2924/01015* (2013.01); *H01L 2924/01033* (2013.01); *H01L 2924/12042* (2013.01); *H01L 2924/14* (2013.01); *H01L 2924/15311* (2013.01); *H01L 2924/1617* (2013.01); *H01L 2924/181* (2013.01); *H01L 2924/19043* (2013.01); *H01L 2924/3025* (2013.01)

(58) Field of Classification Search
USPC .......................................... 438/64, 464, 107
See application file for complete search history.

(56) References Cited

U.S. PATENT DOCUMENTS

| | | | |
|---|---|---|---|
| 5,639,989 A | 6/1997 | Higgins, III | |
| 5,814,894 A | 9/1998 | Igarashi et al. | |
| 5,866,953 A | 2/1999 | Akram et al. | |
| 6,075,289 A | 6/2000 | Distefano | |
| 6,133,634 A | 10/2000 | Joshi | |
| 6,294,731 B1 | 9/2001 | Lu et al. | |
| 6,444,498 B1 | 9/2002 | Huang et al. | |
| 6,465,893 B1 | 10/2002 | Khandros et al. | |
| 6,472,724 B1 | 10/2002 | Matsuzawa et al. | |
| 6,492,194 B1 | 12/2002 | Bureau et al. | |
| 6,602,739 B1 * | 8/2003 | Rose | H01L 21/4857 257/E21.511 |
| 6,602,740 B1 | 8/2003 | Mitchall | |
| 6,722,030 B1 | 4/2004 | Stelzl et al. | |
| 6,794,222 B1 * | 9/2004 | Kraft | H01L 21/568 257/E21.509 |
| 6,838,748 B2 | 1/2005 | Ishio et al. | |
| 6,929,849 B2 | 8/2005 | Koskenmaki et al. | |
| 6,946,740 B2 | 9/2005 | Schaffer | |
| 6,962,829 B2 * | 11/2005 | Glenn | H01L 21/56 257/E21.502 |
| 6,992,400 B2 | 1/2006 | Tikka et al. | |
| 7,045,459 B2 | 5/2006 | Freidhoff | |
| 7,098,074 B2 | 8/2006 | Warner et al. | |
| 7,259,041 B2 | 8/2007 | Stelzl et al. | |
| 7,282,804 B2 | 10/2007 | Lee | |
| 7,381,583 B1 | 6/2008 | Ebel et al. | |
| 7,478,474 B2 | 1/2009 | Koga | |
| 7,552,532 B2 | 6/2009 | Stelzl et al. | |
| 7,629,674 B1 | 12/2009 | Foster | |
| 7,659,604 B2 | 2/2010 | Fujiwara et al. | |
| 7,687,895 B2 | 3/2010 | Brunnbauer et al. | |
| 7,978,070 B2 | 7/2011 | Hunter | |
| 8,309,454 B2 | 11/2012 | Brunnbauer et al. | |
| 2002/0166686 A1 * | 11/2002 | Toyoda | H01Q 17/00 174/524 |
| 2003/0059976 A1 * | 3/2003 | Nathan | H01L 23/5389 438/106 |
| 2003/0109077 A1 | 6/2003 | Kim et al. | |
| 2004/0147825 A1 * | 7/2004 | Milojevic | A61N 1/0541 600/372 |
| 2005/0029666 A1 | 2/2005 | Kurihara et al. | |
| 2005/0046001 A1 | 3/2005 | Warner | |
| 2005/0194666 A1 | 9/2005 | Huang et al. | |
| 2006/0145361 A1 | 7/2006 | Yang et al. | |
| 2007/0045829 A1 | 3/2007 | Jeong et al. | |
| 2007/0076390 A1 | 4/2007 | Kroener et al. | |
| 2007/0123001 A1 | 5/2007 | Reis | |
| 2007/0138614 A1 | 6/2007 | Harrison et al. | |
| 2007/0145539 A1 | 6/2007 | Lam | |
| 2007/0145541 A1 | 6/2007 | Lee et al. | |
| 2007/0262436 A1 | 11/2007 | Kweon et al. | |
| 2013/0228904 A1 | 9/2013 | Brunnbauer et al. | |

OTHER PUBLICATIONS

Final Office Action dated Jan. 8, 2010 for U.S. Appl. No. 11/746,936.
Non-Final Office Action dated Jul. 22, 2011 for U.S. Appl. No. 11/746,936.
Non-Final Office Action dated Nov. 4, 2011 for U.S. Appl. No. 11/746,936.
Notice of Allowance dated Jul. 18, 2012 for U.S. Appl. No. 11/746,936.
Non-Final Office Action dated Apr. 20, 2009 for U.S. Appl. No. 11/939,938.
Notice of Allowance dated Nov. 17, 2009 for U.S. Appl. No. 11/939,938.
Non-Final Office Action dated Sep. 19, 2013 for U.S. Appl. No. 13/673,318. 13 Pages.
Notice of Allowance dated Mar. 12, 2014 for U.S. Appl. No. 13/673,318. 24 Pages.
Non-Final Office Action dated Jul. 14, 2014 for U.S. Appl. No. 14/330,066. 24 Pages.
Notice of Allowance dated Nov. 24, 2015 for U.S. Appl. No. 14/330,066. 24 Pages.

* cited by examiner

WORKPIECE WITH SEMICONDUCTOR CHIPS, SEMICONDUCTOR DEVICE AND METHOD FOR PRODUCING A WORKPIECE WITH SEMICONDUCTOR CHIPS

REFERENCE TO RELATED APPLICATIONS

This Application is a Divisional of U.S. application Ser. No. 14/330,066 filed on Jul. 14, 2014, which is a Continuation of U.S. application Ser. No. 13/673,318 filed on Nov. 9, 2012 (now U.S. Pat. No. 8,779,563 issued on Jul. 15, 2014), which is a Continuation of U.S. application Ser. No. 11/746,936, filed on May 10, 2007 (now U.S. Pat. No. 8,309,454 issued on Nov. 13, 2012), which claims priority to German Application number 10 2007 020 656.0 filed on Apr. 30, 2007, the contents of which are hereby incorporated by reference in their entirety.

FIELD

The disclosure relates to a workpiece with semiconductor chips, such as for example a panel with semiconductor chips arranged in semiconductor device positions. It also relates to a semiconductor device and to a method for producing the workpiece.

BACKGROUND

In the production of semiconductor devices, successful results have been obtained with methods in which a composite panel or so-called "reconfigured wafer" is first produced by the "wafer molding" process from semiconductor chips that are embedded with a main surface and side faces in a plastic molding compound. First main surfaces of the semiconductor chips thereby form a coplanar surface with the upper side of the plastic compound or the first main surface of the composite panel or of the "reconfigured wafer". A wiring structure is then applied to this coplanar surface, it being possible for the plastic surface around the front side of each semiconductor chip to be used for accommodating additional terminals or for arranging contact terminal areas of any desired sizes and spacings.

In the case of such a method, electrostatic discharges (ESD) may occur, and may cause damage to the semiconductor chips or even their destruction. Furthermore, the semiconductor chips of semiconductor devices should be protected from disturbing influences of electromagnetic radiation.

SUMMARY

According to an embodiment of the disclosure, a workpiece which comprises at least two semiconductor chips is provided, each semiconductor chip having a first main surface, which is at least partially exposed, and a second main surface. The workpiece also comprises an electrically conducting layer arranged on the at least two semiconductor chips, the electrically conducting layer being arranged at least on regions of the second main surface, and a molding compound being arranged on the electrically conducting layer.

BRIEF DESCRIPTION OF THE DRAWINGS

Embodiments of the disclosure are now described with reference to the accompanying figures.

DETAILED DESCRIPTION

The same parts are provided with the same designations in all the figures.

Figure 1:
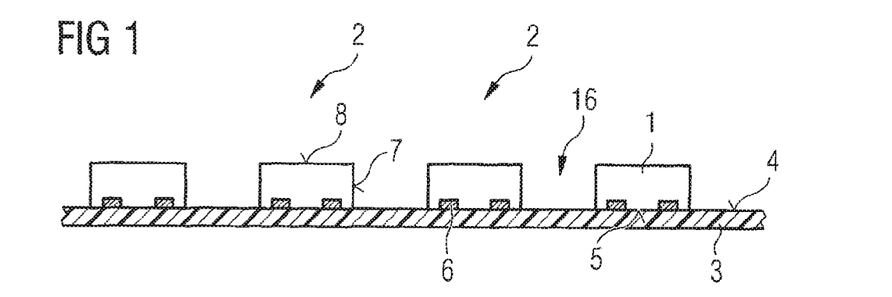
FIG. 1 schematically shows a step of a method for producing a workpiece according to one aspect of the disclosure.

FIG. 1 shows a carrier sheet 3, on the upper side 4 of which semiconductor chips 1 have been applied in semiconductor device positions 2 that are arranged in rows and columns to produce a workpiece, which in this embodiment is a panel. In this context, "workpiece" is understood as meaning an article that is still intended for further processing, for example an intermediate product in the production of semiconductor devices, such as a panel. The semiconductor chips 1 have previously been singulated from a semiconductor wafer. Interspaces 16 are formed between the semiconductor chips 1.

In this exemplary embodiment, the semiconductor chips 1 have first main surfaces 5 with active semiconductor chip structures such as integrated circuits and contact areas 6. The side faces 7 and the second main surfaces 8 of the semiconductor chips 1 are passive. Alternatively, active regions may also be arranged on the second main surface of the semiconductor chips or on the first and second main surfaces.

Figure 2:
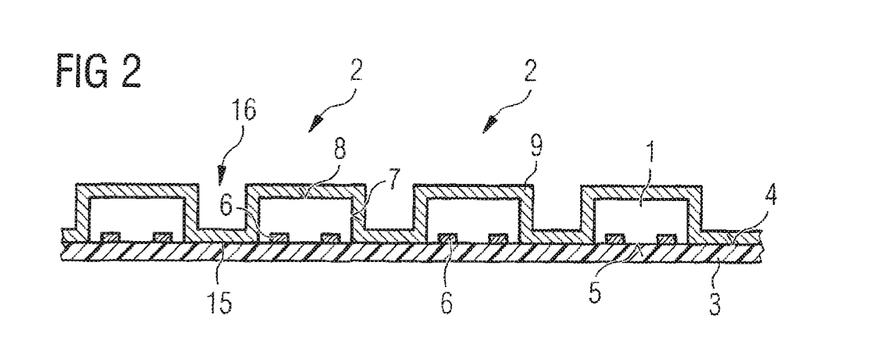
FIG. 2 schematically shows a further step of the method for producing a workpiece.

A further method step is represented in FIG. 2. An electrically conducting layer 9 is applied to regions of the second main surfaces 8 and the side faces 7 of the semiconductor chips 1. In the exemplary embodiment represented, the electrically conducting layer 9 thereby also covers regions of the upper side 4 of the carrier 3 in the interspaces 16 between the semiconductor chips and in this way connects the semiconductor chips 1 to one another in an electrically conducting manner. In an exemplary embodiment that is not shown, the electrically conducting layer 9 is not applied directly to the side faces 7, but instead an intermediate layer is arranged between the side faces 7 and the electrically conducting layer 9 and may be formed for example like a ramp. Such a ramp can facilitate uniform application of the electrically conducting layer 9.

The electrically conducting layer 9 typically has a thickness d of less than 100 µm, if it is produced from a filled or electrically conducting polymer. Layer thicknesses of 20 µm≤d≤50 µm are advantageous for example. If the electrically conducting layer 9 is produced from a metal, it typically has a layer thickness d of a few micrometers or tenths of a micrometer, for example 0.1 µm≤d≤2 µm.

At least in regions in the interspaces 16, the electrically conducting layer 9 has interfaces with the carrier 3. In a later stage of the method, when the carrier 3 is removed, these interfaces become exposed contact regions 15, by means of which the electrically conducting layer 9 is accessible for electrical contacting.

Figure 3:
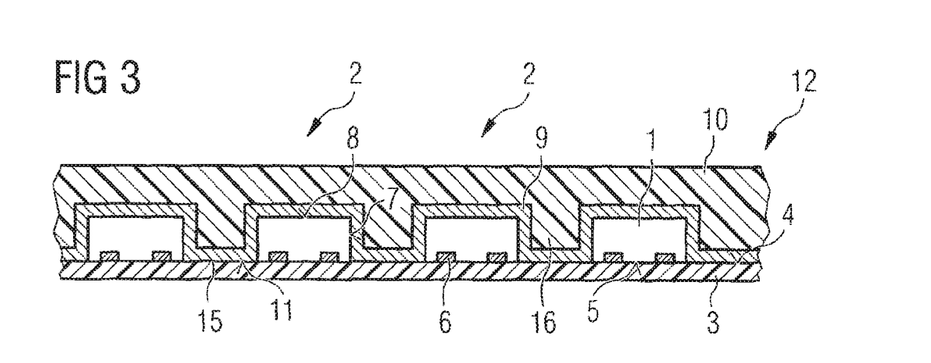
FIG. 3 schematically shows a further step of the method for producing a workpiece.

In a further method step, as represented in FIG. 3, the semiconductor chips 1 are embedded with their side faces 7 and their second main surfaces 8 in a molding compound 10. In this way, the workpiece 12 is obtained as a composite sheet comprising semiconductor chips 1, molding compound 10 and electrically conducting layer 9.

In the case where the electrically conducting layer 9 is applied as a closed layer, the carrier sheet 3 is covered by the electrically conducting layer 9 in the entire region of the interspaces 16. A closed layer is understood here as meaning a layer that is applied over a large surface area and covers the main part of the first main surface 11 of the workpiece 12 outside chip regions that are defined by the first main surfaces of the semiconductor chips. In this case, after removal of the carrier sheet 3, the first main surfaces 5 of the semiconductor chips 1 and regions of the electrically conducting layer 9 on the first main surface 11 of the workpiece 12 are exposed, but no molding compound 10 is exposed.

In an alternative embodiment, however, the electrically conducting layer 9 is formed as a grid structure and only covers regions of the second main surfaces 8 and possibly of the side faces 7 and the interspaces 16. The grid structure in this case comprises for example rows and columns of the electrically conducting layer 9, the grid being so closely meshed that there is at least one column respectively crossing a row on the second main surface 8 of a semiconductor chip 1. In this case, the molding compound 10 penetrates inbetween, to the upper side 4 of the carrier sheet 3, and after removal of the carrier sheet 3 is exposed on the front side 11 of the workpiece 12.

The front side 11 of the workpiece 12 is consequently a coplanar surface comprising the first main surfaces 5 of the semiconductor chips 1 in the semiconductor device positions 2, contact regions 15 of the electrically conducting layer 9 and possibly molding compound 10.

The electrically conducting layer 9 is formed for example from a conductive polymer, a metal or a plastic with electrically conducting particles. Application is performed, for example, by printing on a conductive polymer or a conductive ink, by vapor deposition, by sputtering or by placing on a metal mesh or a netting or a gauze-like fabric of a conductive polymer.

A thermoplastic or thermosetting material is provided as the molding compound 10, and is applied for example by injection-molding onto the electrically conducting layer 9.

Figure 4:
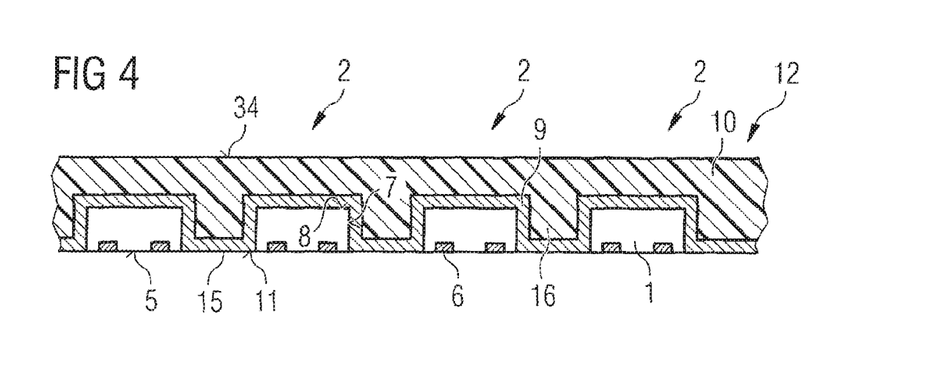
FIG. 4 schematically shows a section through the workpiece.

FIG. 4 schematically shows a cross section through the workpiece 12 produced, after removal of the carrier sheet 3. The first main surfaces 5 of the semiconductor chips 1, which in this embodiment have active structures, are exposed on the first main surface 11 of the workpiece 12. The first main surface 11 of the workpiece 12 is a coplanar surface comprising the first main surfaces 5 of the semiconductor chips 1, contact regions 15 of the electrically conducting layer 9 and possibly molding compound 10. In the contact regions 15, the electrically conducting layer 9 is exposed on the first main surface 11 of the workpiece 12 and can be contacted for discharging the workpiece 12 or for preventing electrostatic charging. The second main surface 34 of the workpiece 12 is formed by the molding compound 10.

Figure 5:
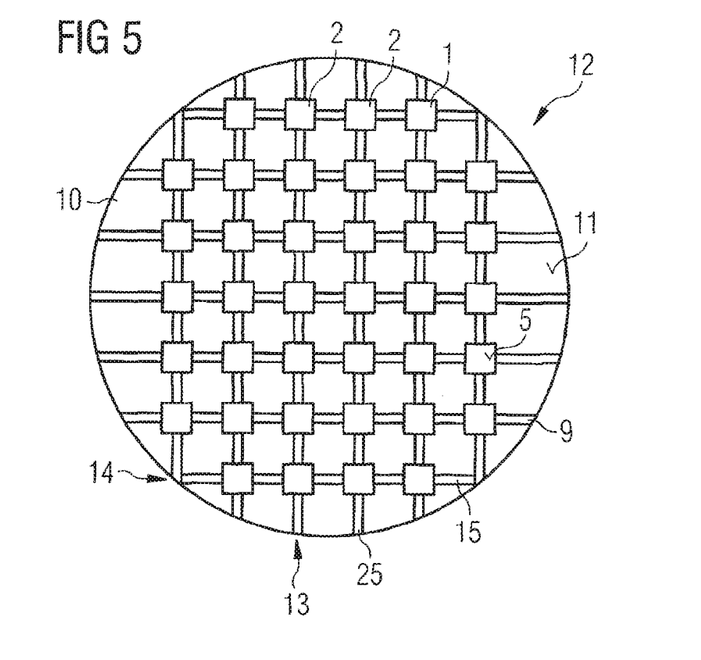
FIG. 5 schematically shows a plan view of the workpiece.

FIG. 5 shows a plan view of the first main surface 11 of the workpiece 12 after removal of the carrier sheet 3. In this exemplary embodiment, the workpiece is formed as a panel with semiconductor chips 1 arranged in rows and columns, which has the form and the dimensions of a semiconductor wafer. In this embodiment, the electrically conducting layer 9 has been applied in continuous strips 25, which follow in their direction the rows 14 and columns 13 in which the semiconductor chips 1 are arranged in the semiconductor device positions 2. In this case, two strips 25 from directions perpendicular to each other respectively cross on the second main surface 8 of a semiconductor chip 1, with the result that the electrically conducting layer 9 forms a grid, semiconductor chips 1 respectively being arranged on the grid points. In this way, all the semiconductor chips 1 of a panel can be conductively connected to one another in a simple way.

The conductive strips 25, which respectively form the rows 14 and columns 13, are exposed in the interspaces 16 between the semiconductor chips 1 on the first main surface 11 of the workpiece 12, where they form contact regions 15. Since, however, only these conductive strips 25 are exposed, and the remaining surface area of the first main surface 11 of the workpiece 12 that is not taken up by the first main surfaces 5 of the semiconductor chips 1 is formed by molding compound 10, adequate electrically insulating surface area is available for the arrangement of other elements, for example external contact areas for semiconductor devices.

The first main surface 11 of the workpiece 12 is a coplanar surface comprising the first main surfaces 5 of the semiconductor chips 1, regions of the molding compound 10 and contact regions 15 of the electrically conducting layer 9, it being possible for all the semiconductor chips 1 to be electrically contacted by means of the contact regions 15. After the removal of the carrier sheet 3, a wiring structure with interconnects and external contacts can be applied to the then exposed first main surface 11 of the workpiece 12.

In the embodiment shown, the electrically conducting layer 9 is formed as a grid structure. In an exemplary embodiment that is not shown, the grid is more closely meshed, with the result that a number of rows 14 and columns 13 respectively cross on the second main surface 8 of a semiconductor chip 1.

However, the electrically conducting layer 9 may also be differently formed, for example as a substantially closed layer. A closed layer has the advantage that it can be applied particularly simply. However, in this case the entire, or virtually entire, region of the first main surface 11 of the workpiece 12 that is not taken up by the first main surfaces 5 of the semiconductor chips 1 is covered by the conductive layer 9. In order to form wiring structures and/or external contacts on it, an insulating layer must first be applied again, it being possible for contact regions 15 to be left exposed.

The contact regions 15 permit the electrical contacting of all, or at least many, of the semiconductor chips 1, which are connected to one another in an electrically conducting manner to form a contact group. This allows electrostatic charges of the workpiece 12, for example a panel, to be prevented or dissipated as quickly as possible during processing. As a result, it is not necessary to handle and process devices that are susceptible to ESD only in a specially protected environment, for which relatively complex devices are required, such as ionizers for generating ionized ambient air and electrically conductive work surfaces that prevent electrostatic charging of the devices as completely as possible.

Instead, low charges of the workpiece 12 during processing are specifically dissipated before they reach a critical value, by contacting of the electrically conducting layer 9 in the contact regions 15. For this purpose, the semiconductor chips 1 in the workpiece 12 are conductively connected to one another by a discharge structure in the form of the electrically conducting layer 9, and contact regions 15 on the first main surface 11 of the workpiece 12 are created to allow easy access to the entire discharge structure, with the result that a potential equalization can take place at any time during processing to dissipate possible charges.

If the electrically conducting layer 9 is contiguous, single contacting is sufficient to discharge the entire workpiece 12. If, on the other hand, the workpiece 12 is to be discharged region by region, for example row by row or column by column, the electrically conducting layer may also be made up of a number of partial regions that are insulated from one another.

With the method described, the application of a possibly structured discharge structure, and in particular contacting of the second main surface 8 of the semiconductor chips 1 by the electrically conducting layer 9 is possible in a single step on the entire workpiece 12. This is accompanied by an enormous saving in terms of time and cost and in this way makes laborious precautions for a specially protected environment unnecessary.

Since, with potential equalization, only relatively small currents are expected, the resistance of the electrically conducting layer 9 may also be greater than that of a metallic layer. Therefore, not only metals are conceivable as materials for the layer 9, but also for example electrically conducting polymers or plastics with electrically conducting particles. This has the advantage that the material for the layer 9 can be selected on the basis of other criteria, for example on the basis of easy applicability and processability.

Figure 6:
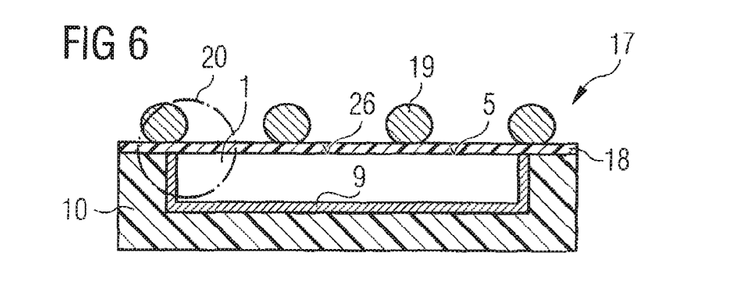
FIG. 6 schematically shows a cross section through a semiconductor device according to one aspect of the disclosure.

FIG. 6 schematically shows a cross section through a semiconductor device 17, which has been singulated from the workpiece 12 according to FIGS. 4 and 5, for example by sawing along dicing tracks that are not shown.

The semiconductor device 17 has a semiconductor chip 1, which is embedded with its side faces 7 and its second main surface 8 in a molding compound 10. An electrically conducting layer 9 is arranged along the semiconductor chip contour on the side faces 7 and the first main surface 8. In the case of this exemplary embodiment, only regions of the first main surface 26 of the semiconductor device 17 are formed by contact regions of the electrically conducting layer 9, these contact regions not being visible in the sectional view that is shown. The second main surface 37 of the semiconductor device 17 is formed by the molding compound 10.

The semiconductor device has on its first main surface 26 a wiring layer 18, which is typically multilayered, and external contacts 19. The cutout 20 is represented in detail in FIG. 7.

Figure 7:
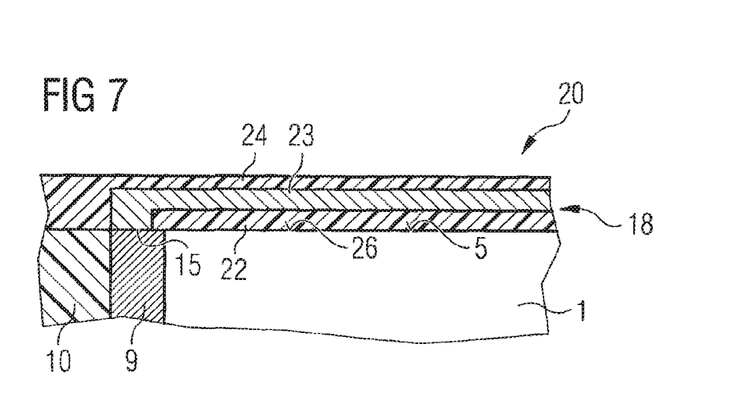
FIG. 7 shows a cutout from the semiconductor device according to FIG. 6.

FIG. 7 shows the cutout 20 from FIG. 6. It can be seen from this that the wiring layer 18 in this case comprises three layers, to be specific one layer of a dielectric 22 directly on the first main surface 5 of the semiconductor chip 1 or on the first main surface 26 of the semiconductor device 17, an electrically conductive layer on that, which forms interconnects 23, and a further insulating layer of a dielectric 24.

In the contact region 15, the electrically conducting layer 9 butts against the first main surface 26 of the semiconductor device 17. At this point, the interconnect 23 is in electrical contact with the electrically conducting layer 9. In this way, the electrically conducting layer can be contacted by means of the external contacts of the semiconductor device 17 also in the case of the finished semiconductor device 17, in which the contact regions 15 themselves are no longer exposed. The molding compound 10 covering the electrically conducting layer 9 forms a plastic package for the semiconductor device 17.

Figure 8:
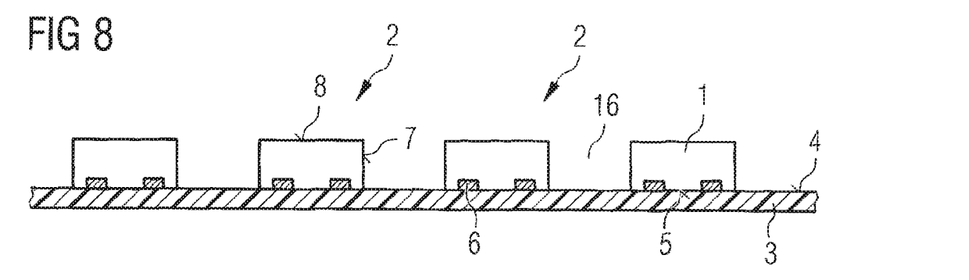
FIG. 8 schematically shows a step of a method for producing a workpiece according to a second embodiment of the disclosure.

FIG. 8 schematically shows a step of a method for producing a workpiece according to a second embodiment of the disclosure. It is also the case with this embodiment that, in a first method step, a number of semiconductor chips 1 are applied with their first main surfaces 5 onto the upper side 4 of a carrier sheet 3, interspaces 16 being arranged between the semiconductor chips 1.

Figure 9:
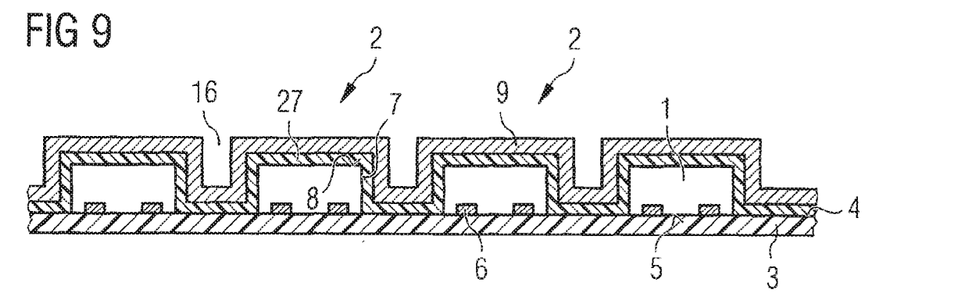
FIG. 9 schematically shows a further step of the method for producing a workpiece according to the second embodiment.

FIG. 9 shows a further step of the method according to the second embodiment. An insulating layer 27 of an electrically insulating material is first arranged on the second main surfaces 8 of the semiconductor chips 1, and possibly also on the side faces 7. Parylene or polyimide is used for example as the insulating material. The insulating layer 27 may, for example, be vapor-deposited or applied by placing on an electrically insulating film.

The depositing of a parylene layer as an insulating layer 27 is performed for example by gas-phase polymerization: firstly, the dimer of the compound is vaporized. The dimer is prepared for example by dehydrating pyrolitic dimerization of p-xylene and subsequent quenching in liquid p-xylene. In this way, [2,2]-p-cyclophane is obtained. In the subsequent pyrolysis of the dimer, the dimer splits into two bivalent radical monomers such as p-xylene. During the deposition of the monomers, which are in the gas phase, on the surfaces to be coated, the polymerization takes place on cooling. By this process, a very pure parylene coating can be deposited. The vaporization is carried out for example at a temperature of 160° C. to 180° C. and a pressure of 1-2 mbar and the pyrolysis is carried out at a temperature of 660° C. to 690° C. and a pressure of 0.5-1 mbar. The polymerization takes place for example at a temperature of less than 35° C. and a pressure of 0.1-0.2 mbar. This process permits very uniform deposition of the insulating layer 27, which as a result has virtually the same thickness in all regions.

Subsequently, the electrically conducting layer 9 is applied to the insulating layer 27, with the result that the insulating layer 27 is arranged between the semiconductor chips 1 and the electrically conducting layer 9. It is also the case with this embodiment that the electrically conducting layer 9 may be formed from a conductive polymer, a metal or a plastic with electrically conducting particles. Application is likewise performed, for example, by printing on a conductive polymer or a conductive ink, by vapor deposition, by sputtering or by placing on a metal mesh or a netting or a gauze-like fabric of a conductive polymer.

In the case of this embodiment, the electrically conducting layer 9 forms an electromagnetic shielding of the semiconductor chips 1. Such a shielding protects the semiconductor chips 1 from disturbing influences of electromagnetic radiation, which is necessary in particular in the case of applications such as baseband processors, power management units or radio-frequency circuits.

Figure 10:
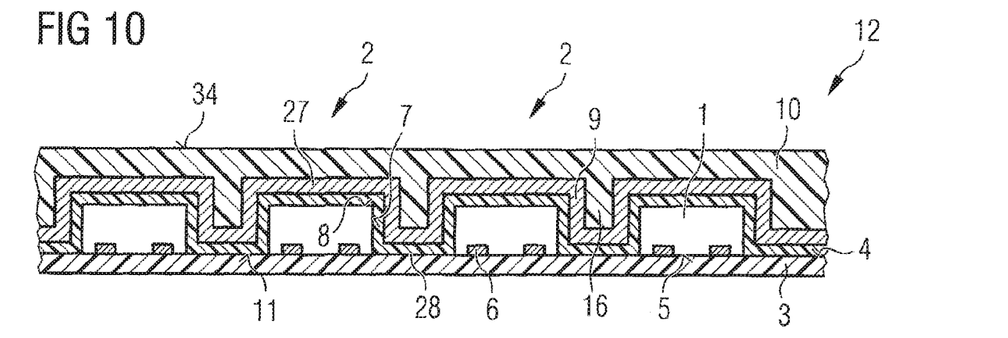
FIG. 10 schematically shows a further step of the method for producing a workpiece according to the second embodiment.

In a further method step, the result of which is shown in FIG. 10, a molding compound 10 is arranged on the electrically conducting layer 9, with the result that the second main surface 34 of the workpiece 12 is formed by the molding compound 10. A thermoplastic or thermosetting material, which is applied to the electrically conducting layer 9 by injection molding, for example, is provided as the molding compound 10. In the embodiment shown, the side faces 7 and the second main surfaces 8 of the semiconductor chips 1 are embedded in the molding compound 10.

In the embodiment represented, the workpiece 12 is formed as a panel with semiconductor chips 1 arranged in rows and columns at semiconductor device positions 2. The method described according to the second embodiment makes it possible to apply the electromagnetic shielding to all the semiconductor chips 1 of a panel already at the wafer level. The shielding is accordingly firmly integrated in the package of the semiconductor devices, with the result that a particularly compact semiconductor device and at the same time a particularly simple production method can be provided.

Figure 11:
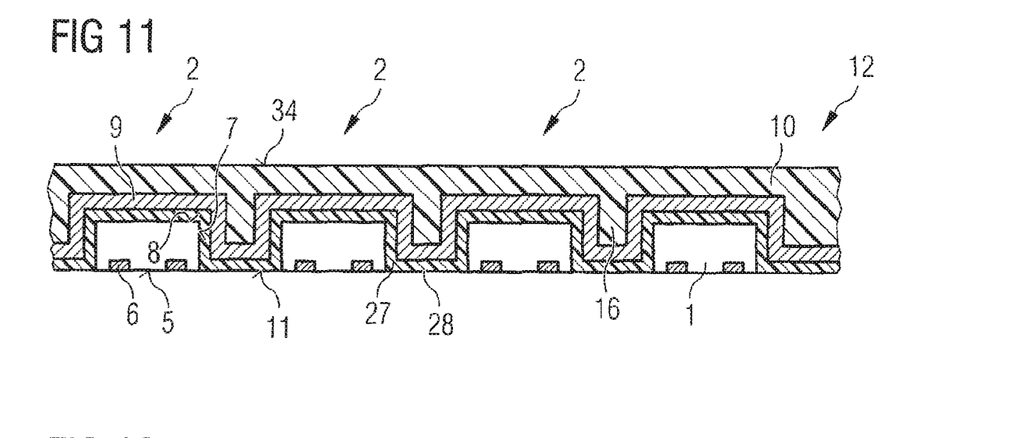
FIG. 11 schematically shows a section through the workpiece according to the second embodiment.

In a further method step, the result of which is shown in FIG. 11, the carrier sheet 3 is removed, with the result that the first main surfaces 5 of the semiconductor chips 1 and regions 28 of the insulating layer 27, which together form a coplanar surface and the first main surface 11 of the workpiece 12, are exposed. Then, as described above, a wiring layer is applied to the exposed first main surface 11.

Figure 12:
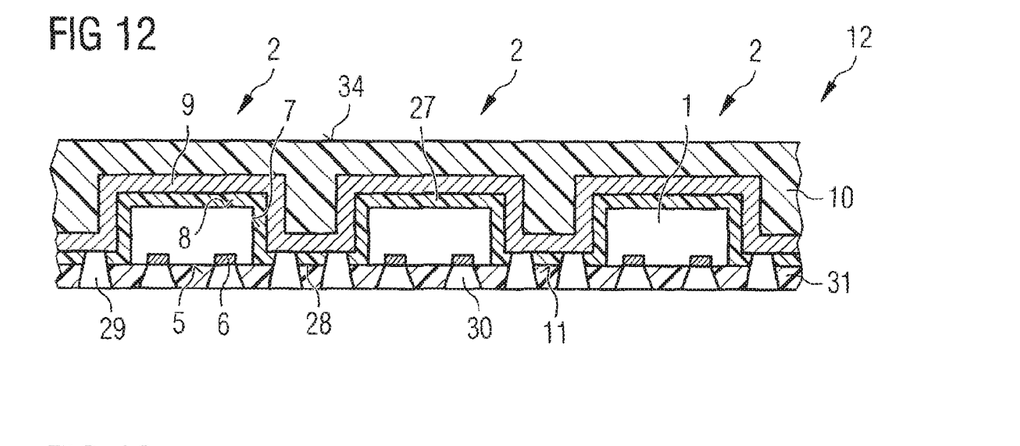
FIG. 12 schematically shows a further step of the method for producing a workpiece according to the second embodiment.

FIG. 12 schematically shows a further method step according to the second embodiment. The carrier sheet has already been removed from the first main surface 11 of the workpiece 12 and a dielectric layer 31 has been applied as part of a wiring layer to the first main surface 11. In the dielectric layer 31, vias 29 or through-holes for shielding and vias 30 to contact areas 6 of the semiconductor chips 1 are opened, for example by a (dry or wet) etching process or by laser ablation.

Figure 13:
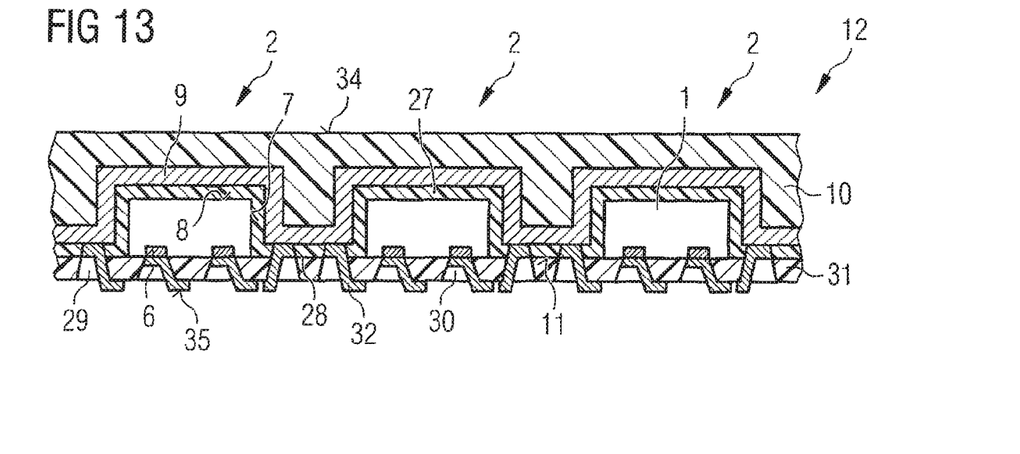
FIG. 13 schematically shows a further step of the method for producing a workpiece according to the second embodiment.

FIG. 13 shows a further method step, in which a metallization 32 is applied as part of a wiring layer. With the metallization 32, the electrically conducting layer 9 is contacted through the vias 29 and the contact areas 6 of the semiconductor chips 11 are contacted through the vias 30. Furthermore, external contact areas 35 for applying external contacts are formed.

Figure 14:
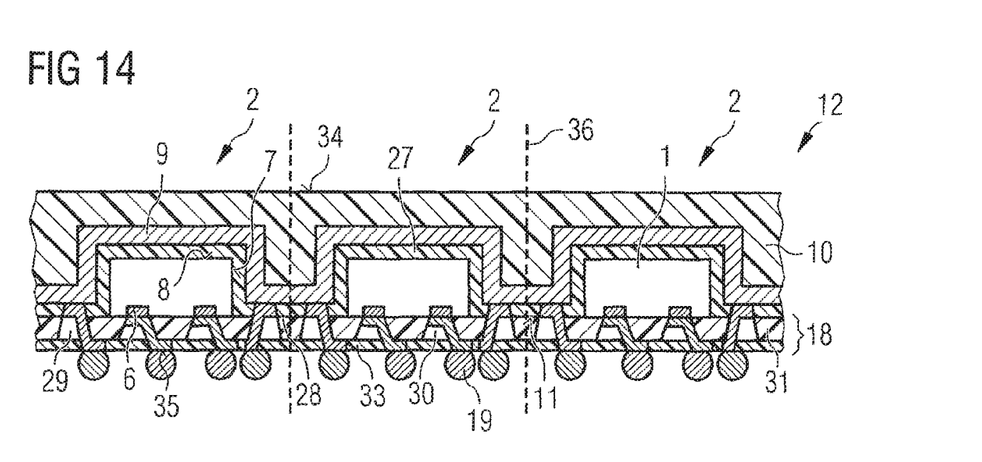
FIG. 14 schematically shows a further step of the method for producing a workpiece according to the second embodiment and FIG. 15 schematically shows a cross section through a finished semiconductor device according to the second embodiment of the disclosure.

FIG. 14 shows a subsequent method step, in which a solder resist layer 33 has been applied to the dielectric layer 31 and structured, in order to leave the external contact areas 35 exposed for applying external contacts. External contacts 19 are applied to the external contact areas 35, for example in the form of solder balls. The workpiece 12 can subsequently be divided up along dicing tracks, which are indicated by the dashed lines 36, into individual semiconductor devices, for example by sawing.

Figure 15:
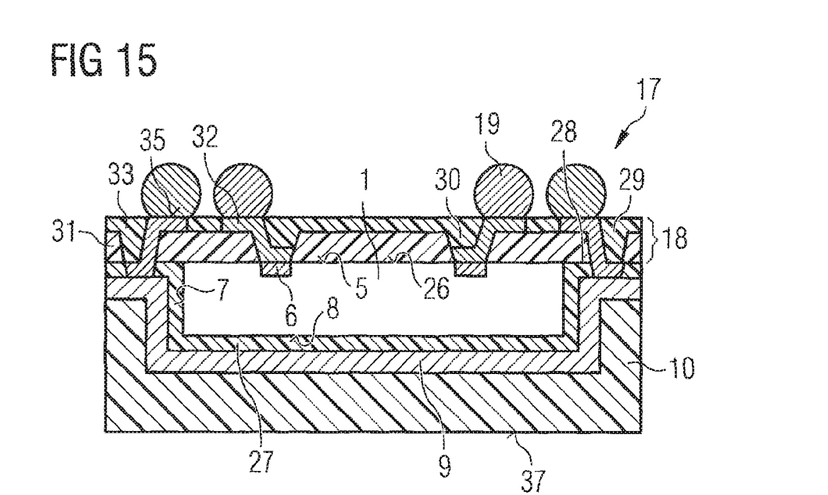

A completed semiconductor device 17 according to the second embodiment of the disclosure is shown in FIG. 15. In this embodiment, the semiconductor device 17 has a semiconductor chip 1 with the first main surface 5, the second main surface 8 and the side faces 7. The electrically conducting layer 9 arranged on the semiconductor chip 1, which layer is arranged at least on regions of the second main surface 8, forms an electromagnetic shielding of the semiconductor chips 1. The insulating layer 27 is arranged between the semiconductor chip 1 and the electrically conducting layer 9. Arranged on the electrically conducting layer 9 is the molding compound 19, which forms the plastic package of the semiconductor device 17.

In the case of the semiconductor device 17, regions 28 of the insulating layer 27 form a coplanar surface with the first main surface 5 of the semiconductor chip 1 on a first main surface 26 of the semiconductor device 17.

The first main surface 26 of the semiconductor device 17 has a wiring structure or wiring layer 18, which comprises at least the dielectric layer 31, the metallization 32 with the external contact areas 35 and the solder resist layer 33. The wiring layer 18 may, however, also be of a multilayered form and have a number of metallization layers and further contact vias. By means of the external contacts 19, the electrically conducting layer 9 can also be electrically contacted and connected to a predetermined potential. It is also the case in this embodiment that the second main surface 37 of the semiconductor device 17 is formed by the molding compound 10.

The invention claimed is:

1. A method, comprising:
providing a plurality of semiconductor chips each having a first main surface and a second main surface;
placing the first main surface of the plurality of semiconductor chips on a surface of a carrier sheet;
applying an electrically conducting layer to at least one region of the second main surface;
applying a molding compound to at least one region of the electrically conducting layer;
removing the carrier sheet; and
exposing the first main surface, wherein at least one region of the electrically conducting layer forms a coplanar surface with the first main surface of the plurality of semiconductor chips.

2. The method of claim 1, further comprising applying a wiring layer to at least one region of the first main surface.

3. The method of claim 2, further comprising applying a solder ball to a contact area of the wiring layer.

4. The method of claim 1, further comprising applying a dielectric layer to at least one region of the first main surface.

5. The method of claim 4, further comprising opening at least one via in the dielectric layer to expose at least one contact area.

6. The method of claim 4, further comprising opening at least one via to at least one region of the electrically conducting layer.

7. The method of claim 1, wherein applying the electrically conducting layer comprises:
depositing the electrically conductive layer over the second main surface; and
patterning the electrically conductive layer to form a grid structure resulting in a plurality of rows and columns that intersect and that contact the plurality of semiconductor chips.

8. The method of claim 7, wherein the grid structure formed by the plurality of intersecting rows and columns have grid points defined by the respective intersections, and wherein the plurality of semiconductor chips are arranged on respective grid points of the grid.

9. The method of claim 7, wherein the grid structure comprises a single, contiguous structure.

10. The method of claim 7, wherein the grid structure comprises a plurality of partial conductive regions insulated from one another.

11. A method, comprising:
providing a plurality of semiconductor chips each having a first main surface and a second main surface;
placing the first main surface of the plurality of semiconductor chips on a surface of a carrier sheet;
applying an electrically insulating layer to at least one region of the second main surface;
applying an electrically conducting layer to the electrically insulating layer;
applying a molding compound to at least one region of the electrically conducting layer;
removing the carrier sheet and thereby exposing the first main surface, wherein at least one region of the electrically insulating layer forms a coplanar surface with the first main surface of the plurality of semiconductor chips.

12. The method of claim 11, wherein applying the electrically insulating layer comprises depositing the electrically insulating layer using a gas-phase polymerization process.

13. The method of claim 12, wherein the gas-phase polymerization process comprises:
vaporizing a dimer of a compound to be applied as the electrically insulating layer;
performing a pyrolysis of the dimer to form two bivalent radical monomers; and
depositing the two bivalent radical monomers in the gas phase.

14. The method of claim 13, further comprising performing a cooling of the two bivalent radical monomers during the depositing to effectuate a polymerization of the compound.

15. The method of claim 11, further comprising applying a wiring layer to at least one region of the first main surface.

16. The method of claim 15, further comprising applying a solder ball to a contact area of the wiring layer.

17. The method of claim 11, further comprising applying a dielectric layer to at least one region of the first main surface.

18. The method of claim 17, further comprising opening at least one via in the dielectric layer to expose at least one contact area.

19. The method of claim 17, further comprising opening at least one via to at least one region of the electrically conducting layer.

20. The method of claim 11, wherein applying the electrically conducting layer comprises:
depositing the electrically conductive layer over electrically insulating layer that overlies the second main surface; and
patterning the electrically conductive layer to form a grid structure resulting in a plurality of rows and columns that intersect and that contact the plurality of semiconductor chips.

* * * * *